United States Patent
Araki et al.

(10) Patent No.: US 7,919,967 B2
(45) Date of Patent: Apr. 5, 2011

(54) VERIFICATION OF A FABRICATION PROCESS USED TO FORM READ ELEMENTS IN MAGNETIC HEADS

(75) Inventors: Satoru Araki, San Jose, CA (US);
Robert S. Beach, Los Gatos, CA (US);
David J. Seagle, Morgan Hill, CA (US)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 568 days.

(21) Appl. No.: 11/965,502

(22) Filed: Dec. 27, 2007

(65) Prior Publication Data
US 2009/0168214 A1 Jul. 2, 2009

(51) Int. Cl.
*G01R 31/08* (2006.01)
*G01R 27/08* (2006.01)
(52) U.S. Cl. ........................ 324/525; 324/691
(58) Field of Classification Search ............... 324/525, 324/691
See application file for complete search history.

(56) References Cited

U.S. PATENT DOCUMENTS

| | | | |
|---|---|---|---|
| 5,898,548 A | 4/1999 | Dill et al. | |
| 6,097,579 A | 8/2000 | Gill | |
| 6,472,866 B2 | 10/2002 | Aslami | |
| 6,496,334 B1 | 12/2002 | Pang et al. | |
| 6,731,110 B2 * | 5/2004 | Church | 324/210 |
| 6,833,975 B2 | 12/2004 | Fukazawa et al. | |
| 7,206,154 B2 | 4/2007 | Lee et al. | |
| 7,619,431 B2 * | 11/2009 | De Wilde et al. | 324/763 |
| 2007/0076328 A1 | 4/2007 | Jayasekara et al. | |

* cited by examiner

*Primary Examiner* — Amy He
(74) *Attorney, Agent, or Firm* — Duft Bornsen & Fishman, LLP (57) ABSTRACT

Test methods and components are disclosed for testing the quality of a fabrication process used to form read elements in magnetic heads. A wafer is populated with one or more test components along with magnetic heads. The test components are formed by the same or similar fabrication processes as the read elements, but do not include a conductive MR sensor between the test leads. By measuring the resistance of the test components, the formation of parasitic shunts can be identified in the test components, which may indicate the formation of parasitic shunts in the read elements. Thus, the quality of the fabrication process in forming read elements in magnetic head may be determined.

5 Claims, 14 Drawing Sheets

VERIFICATION OF A FABRICATION PROCESS USED TO FORM READ ELEMENTS IN MAGNETIC HEADS

BACKGROUND OF THE INVENTION

1. Field of the Invention

The invention is related to the field of wafer process verification, and in particular, to identifying parasitic shunts formed between the shields in read elements in magnetic heads due to problems in the fabrication process.

2. Statement of the Problem

Wafer fabrication is a procedure composed of many repeated sequential processes to produce electrical circuits, devices, components, etc. One type of device formed through wafer fabrication is magnetic heads. Magnetic heads are used to write to magnetic recording disks and to read from magnetic recording disks, such as in a hard disk drive. Magnetic heads typically include a read element and a write element. The structure of a read element includes a first shield, a magnetoresistance (MR) sensor formed on the first shield, and a second shield formed on the MR sensor. The MR sensor may comprise a Giant MR (GMR) sensor, a Tunneling MR (TMR) sensor, or another type of MR sensor. If the read element is being operated in a current perpendicular to plane (CPP) fashion, then the first shield and the second shield are electrically connected to opposing surfaces of the MR sensor to act as current leads for a sense current that is injected perpendicularly through the MR sensor.

One problem encountered when fabricating read elements in magnetic heads is the inadvertent formation of parasitic shunts between the first shield and the second shield. As the bit densities of magnetic disks have increased, the size of the read element on the magnetic head has decreased. Thus, the shields of the read sensor are formed closer together, which increases the chances of inadvertent parasitic shunts forming between the shields during fabrication. Additionally, there are other layers formed between the shields, such as hard bias magnets, that are separated from the shields by a thin insulating material. These areas of a read element are especially susceptible to parasitic shunts. These parasitic shunts, which are formed in parallel with the MR sensor, are not well controlled and may cause yield loss due to large resistance variations. It would therefore be desirable to effectively and efficiently test the quality of the fabrication processes used to form read elements in magnetic heads to identify the parasitic shunts formed.

SUMMARY OF THE INVENTION

Embodiments of the invention have test components that are fabricated on a wafer along with magnetic heads. The test components are fabricated by the same or similar processes used to form read elements on magnetic heads, but do not include a MR sensor. Because the test components are not formed with a MR sensor, a conductive path between test pads on the test components should not exist. This allows a resistance to be measured on the test components to determine if inadvertent parasitic shunts have formed during the fabrication process. While it would be advantageous to test the read element directly to determine if any parasitic shunts have formed, a conductive path exists between the shields through the MR sensor. This conductive path makes it difficult to determine the relationship between the typical MR element resistance and resistances formed by the parasitic shunts. Because the same or similar processes are used to fabricate the read elements and the test components, parasitic shunts formed in the test components should indicate that parasitic shunts may also have formed in the read elements. Because of this relationship, electrical testing of the test component advantageously allows fabricators to determine the quality of the fabrication processes used to form the read elements in the magnetic heads.

One embodiment of the invention comprises a method of testing the quality of the fabrication processes used to form read elements in magnetic heads on a wafer. For the method, a test component is fabricated along with magnetic heads on a wafer using the same or similar fabrication processes. The test component includes insulating material and hard bias magnet material between two test leads, but does not include a MR sensor. The test component may further include a refill material between the test leads. Because the MR sensor is not present in the test component, a conductive path should not exist between the test leads. By measuring a resistance between the test leads on the test component, parasitic shunts formed by the fabrication process can be identified. Because the test component is fabricated with the same or similar processes used to fabricate the magnetic heads, parasitic shunts formed in the test component will indicate that parasitic shunts may have formed in the read elements on the magnetic heads. The quality of the fabrication processes in forming read elements may then be determined based on the measured resistance.

The invention may include other exemplary embodiments described below.

DESCRIPTION OF THE DRAWINGS

The same reference number represents the same element or same type of element on all drawings.

FIG. 34 is a cross-sectional view of the test component after a milling process according to the method of FIG. 31 in an exemplary embodiment of the invention.

DETAILED DESCRIPTION OF THE INVENTION

FIGS. 1-41 and the following description depict specific exemplary embodiments of the invention to teach those skilled in the art how to make and use the invention. For the purpose of teaching inventive principles, some conventional aspects of the invention have been simplified or omitted. Those skilled in the art will appreciate variations from these embodiments that fall within the scope of the invention. Those skilled in the art will appreciate that the features described below can be combined in various ways to form multiple variations of the invention. As a result, the invention is not limited to the specific embodiments described below, but only by the claims and their equivalents.

Figure 1:
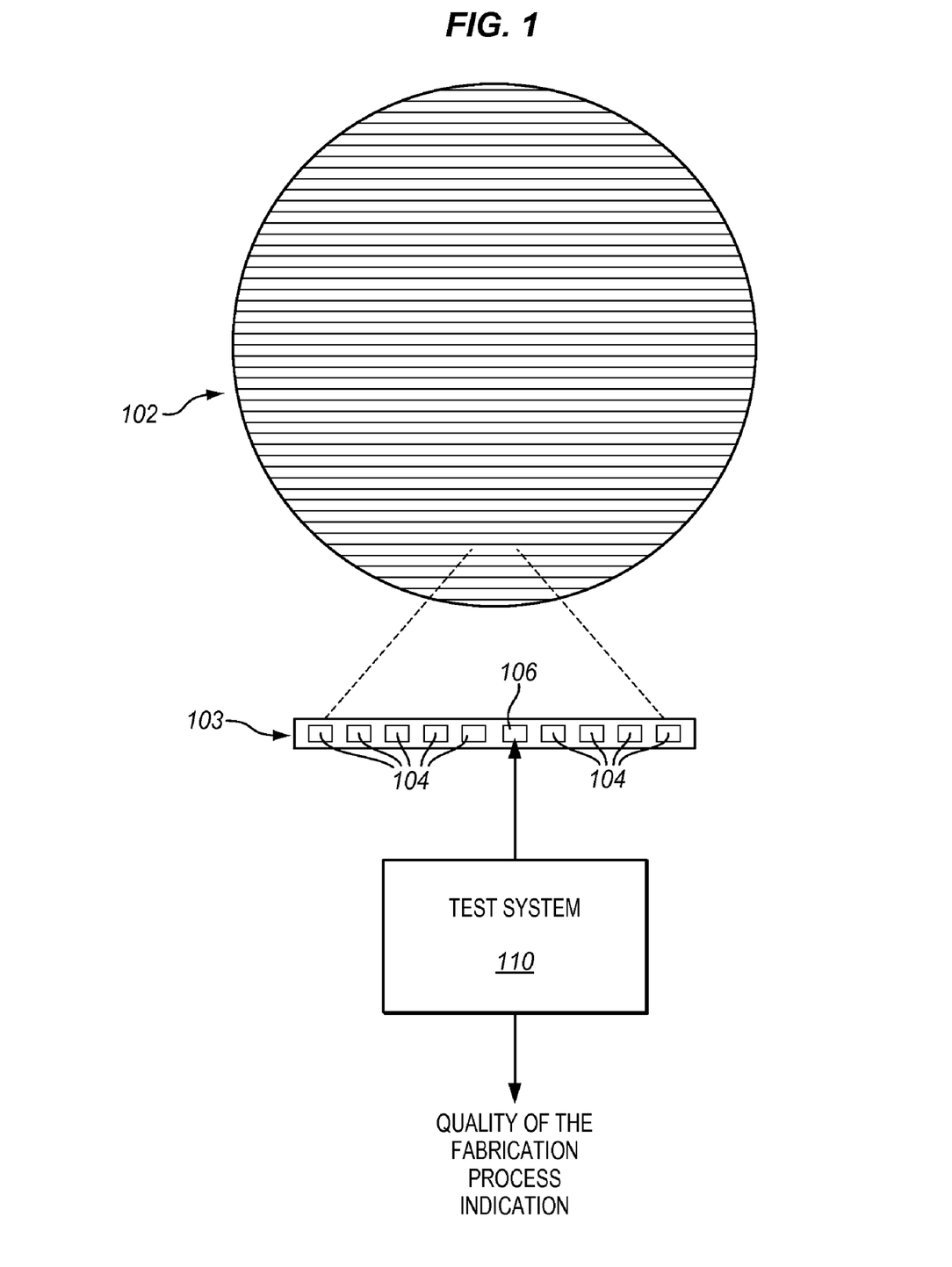
FIG. 1 illustrates a wafer in an exemplary embodiment of the invention.

FIG. 1 illustrates a wafer 102 in an exemplary embodiment of the invention. Wafer 102 comprises a plurality of rows of components, which are illustrated by the horizontal lines across wafer 102. Reference number 103 illustrates a magnified view of a portion of a row on wafer 102. This row on wafer 102 includes a plurality of magnetic heads 104 that are fabricated with functional read elements. A functional read element as provided herein is an actual read element that will be used to read from a magnetic recording media, such as in a hard disk drive. A functional read element includes a first shield, an MR sensor, and a second shield, among other layers. This row on wafer 102 also includes one or more test components 106.

A test component comprises a component fabricated on the wafer in order to test the quality of the fabrication processes used to form read elements in magnetic heads. Although one test component 106 is illustrated in FIG. 1, wafer 102 may be populated with multiple test components 106. Test components 106 may be staggered throughout wafer 102 in order to provide a sampling of read elements in different positions on wafer 102. Test component 106 is configured so that a test system 110 is able to measure the resistance of test component 106.

Figure 2:
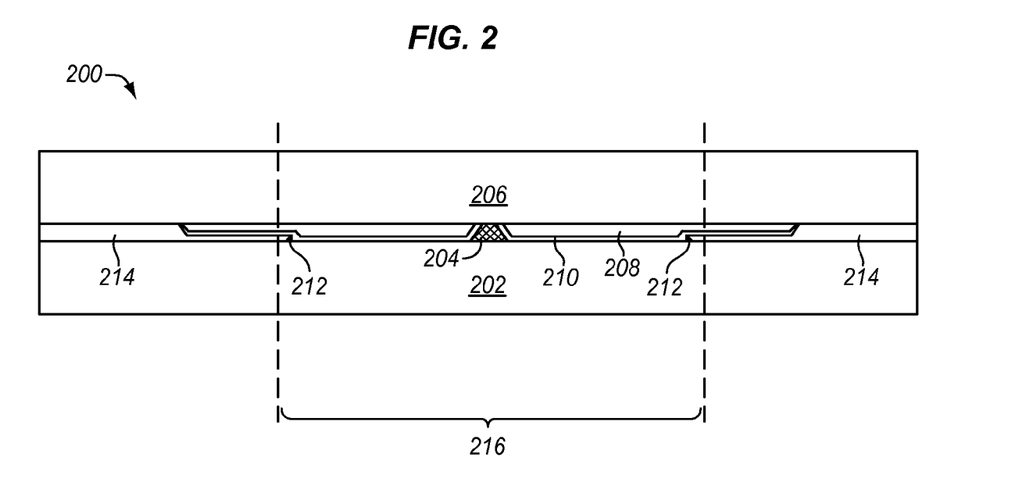
FIG. 2 is a cross-sectional view illustrating a typical read element fabricated in a magnetic head.

FIG. 2 is a cross-sectional view illustrating a typical read element 200 fabricated in a magnetic head 104. Read element 200 includes a first shield 202, an MR sensor 204, and a second shield 206. Read element 200 further includes an insulating material 210 and a hard bias magnet material 208. Read element 200 is being operated in a CPP fashion, so first shield 202 comprises a first lead for read element 200 and second shield 206 comprises a second lead for read element 200. MR sensor 204 may comprise a CPP GMR sensor, a TMR sensor, or another type of MR sensor being operated in a CPP mode. One problem in fabricating read element 200 is that inadvertent parasitic shunts may be formed in region 216 of read element 200. During fabrication, refill material 214 may capture MR material 212 from an incomplete etch process. Because MR material 212 is conductive, an electrical path may exist between the first shield 202 through the MR material 212 to the second shield 206. These potential parasitic shunts are formed in parallel with MR sensor 204.

After a read element 200 is fabricated, it is common for magnetic head fabricators to test the resistance of read element 200. The resistance measurement is taken across first shield 202 and second shield 206, such as by injecting a current into second shield 206 and measuring a voltage across the shields 202 and 206. Ideally no parasitic shunts would be formed by MR material 212, and the resistance measured would be the resistance of MR sensor 204. When the parasitic shunts do exist, they alter the measured resistance of MR sensor 204, which may decrease the performance of MR sensor 204.

Thus, it would be desirable to monitor the fabrication of read element 200 and the formation of the parasitic shunts such that the quality of the fabrication process can be determined.

Figure 3:
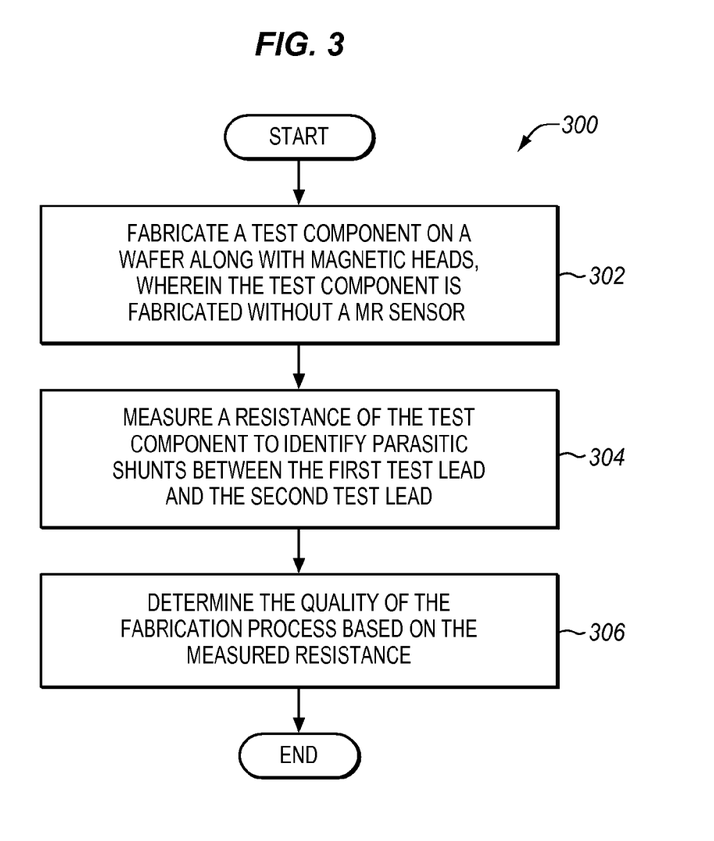
FIG. 3 is a flow chart illustrating a method testing the quality of a fabrication process in an exemplary embodiment of the invention.

FIG. 3 is a flow chart illustrating a method 300 of testing the quality of a fabrication process in an exemplary embodiment of the invention. The steps of the flow chart in FIG. 3 are not all inclusive and may include other steps not shown.

Step 302 comprises fabricating a test component 106 on a wafer 102 along with magnetic heads 104. The test component 106 includes a first test lead, a second test lead, and hard bias magnet material and insulating material between the test leads. In some embodiments the test component 106 may include an additional refill material between the test leads. The test component 106 furthermore does not include an MR sensor. One assumption about test component 106 and magnetic heads 104 is that they are fabricated with the same or similar processes. Because the processes are the same or similar, parasitic shunts formed in the test component 106 may also be formed in read element 200.

Step 304 of FIG. 3 comprises measuring a resistance of the test component to identify parasitic shunts formed. Test component 106 is adapted to allow measuring of the parasitic shunts formed during the fabrication process, because it does not include an MR sensor. The measurement step may include the test system 110 of FIG. 1 adapted to measure resistance of test component 106. The measurement step may also include a 4 point probe system and associated test capabilities to measure the resistance of test component 106.

Step 306 of FIG. 3 comprises determining the quality of the fabrication processes based on the measured resistance of test component 106. While it would be advantageous to test read element 200 directly for inadvertent parasitic shunts formed between the first shield 202 and the second shield 204, the conductive path through MR sensor 204 prevents direct measurement of the parasitic shunts. Because test component 106 is adapted to allow measurements of the parasitic shunts formed during the fabrication process, and that the same or similar processes are used to fabricate read element 200, measurements indicating the formation of parasitic shunts in the test component 106 may also indicate parasitic shunts formed in read element 200. For example, if the resistance measured on test component 106 using test system 110 is less than about ⅓ the target resistance of read element 200 (e.g., about 1K ohms for a present generation TMR sensor, or about 100 ohms for a present generation GMR sensor), this would indicate the formation of parasitic shunts in test component 106, which may also indicate parasitic shunts formed in read element 200. Test system 110 may then indicate to an operator that the fabrication process was inadequate. In another example, if the resistance measured on test component 106 using test system 110 is greater than about ⅓ the target resistance of read element 200 (e.g., about 1K ohms for a present generation TMR sensor, or about 100 ohms for a present generation GMR sensor), this would indicate the lack of formation of parasitic shunts in test component 106, which may also indicate a lack of parasitic shunts formed in read element 200. Test system 110 may then indicate to an operator that the fabrication process was adequate.

Figure 4:
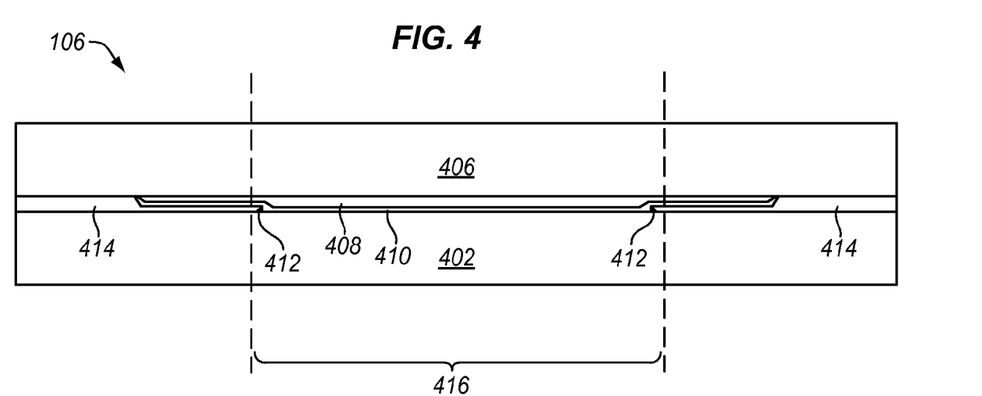
FIG. 4 is a cross-sectional view illustrating one embodiment of a test component in an exemplary embodiment of the invention.

FIG. 4 is a cross-sectional view illustrating one embodiment of a test component in an exemplary embodiment of the invention. One assumption is that test component 106 is fabricated with the same or similar process as read element 200. For example, test component 106 in FIG. 4 has a first test lead 402. First test lead 402 may be the deposited conductive layer for first shield 202 of read element 200 (see FIG. 2). Test component 106 in FIG. 4 also comprises an insulating material 410, hard bias magnet material 408 and a second test lead 406. These elements may be fabricated by the same or similar processes used to fabricate insulating material 210, hard bias magnet material 208, and second shield 206 of read element 200 in FIG. 2. Test component 106 in FIG. 4 is further adapted to measure parasitic shunts formed during fabrication by not including a conductive MR sensor between the first test lead 402 and the second test lead 406. Because test component 106 does not include a conductive MR sensor, an electrical path between the first test lead 402 and the second test lead 406 should not exist. Thus, a resistance measurement between test leads 402 and 406 will be a measurement of the parasitic shunts formed during the fabrication processes. Region 416 shows an area where test component 106 of FIG. 4 is sensitive to parasitic shunts formed by the fabrication process. Potential sites of parasitic shunts are shown as remaining MR material 412, and will be detailed in the fabrication process outlined in FIG. 6.

Figure 5:
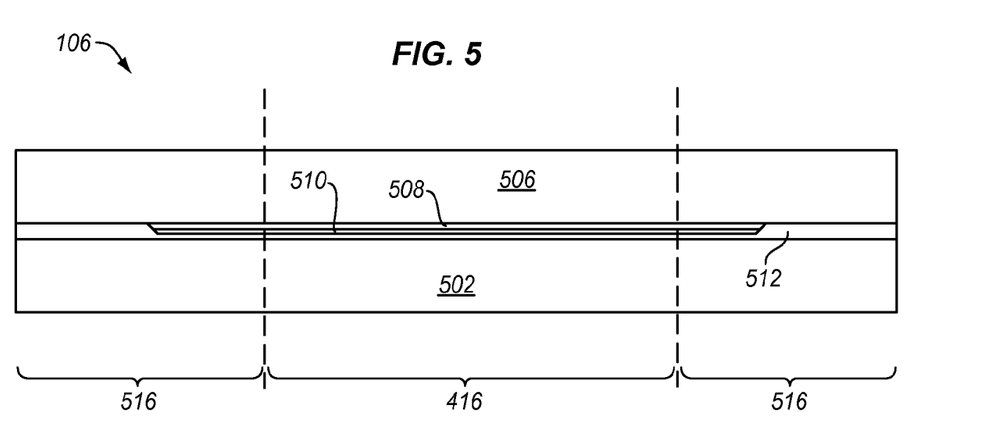
FIG. 5 is a cross-sectional view illustrating another embodiment of a test component in an exemplary embodiment of the invention.

FIG. 5 is a cross-sectional view illustrating another embodiment of a test component 106 in an exemplary embodiment of the invention. FIG. 5 illustrates a first test lead 502, a second test lead 506, hard bias magnet material 508, and insulating material 510. As in the test component of FIG. 4, these elements are similar to the first shield 202, second shield 206, hard bias magnet material 208, and insulating material 210 of read element 200 (see FIG. 2). Test component 106 as illustrated in FIG. 5 further includes a refill material 512. The refill material 512 increases the spacing between the first test lead 502 and the second test lead 506. Because test component 106 in FIG. 5 also does not include a conductive MR sensor, a conductive path from the first test lead 502 and the second test lead 506 also should not exist. Furthermore, because of the increased spacing between test leads 502 and 506 due to refill material 512, test component 106 of FIG. 5 is sensitive to parasitic shunts in regions 516, because it is less likely that parasitic shunts will form in region 416. Steps in fabricating test component 106 as illustrated in FIG. 5 will be detailed in FIG. 31.

Figure 6:
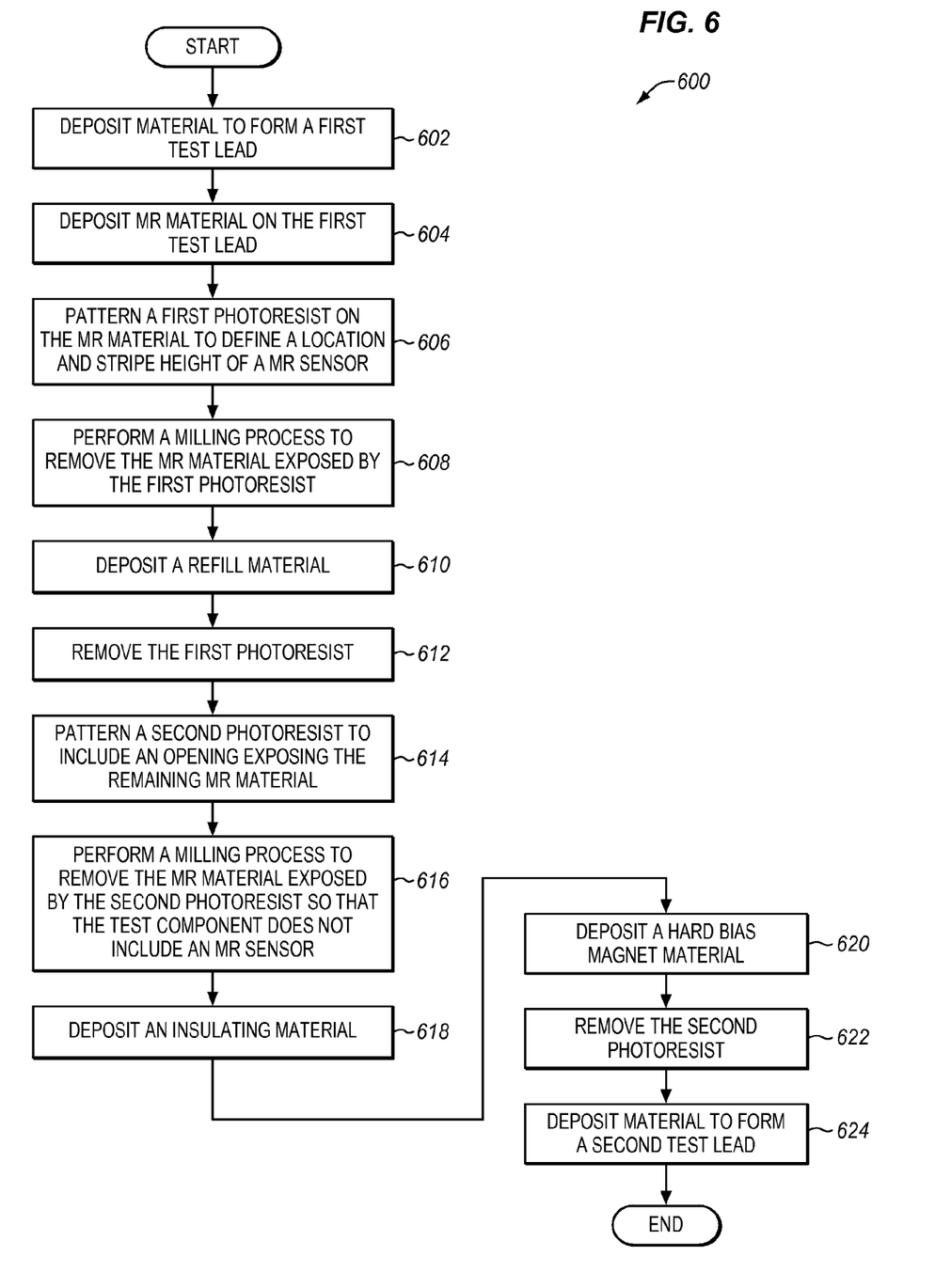
FIG. 6 is a flow chart illustrating a method of fabricating the test component of FIG. 4 in an exemplary embodiment of the invention.

FIG. 6 is a flow chart illustrating a method of fabricating the test component of FIG. 4 in an exemplary embodiment of the invention. The odd numbered figures for FIGS. 7-30 illustrate the results of the steps of method 600 to fabricate the test component 106 of FIG. 4 in an exemplary embodiment of the invention. The even numbered figures for FIGS. 6-29 illustrate the results of the steps to fabricate a functional read element, so that the differences between fabricating the test component 106 and read element 200 are clearly shown. The steps of the flow chart in FIG. 6 are not all inclusive and may include other steps not shown. Method 600 is just one example of how to fabricate test component 106, as other methods may be performed in other embodiments to fabricate test component 106.

Figure 7:
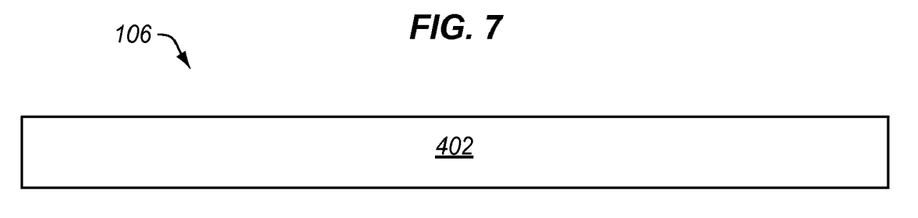
FIG. 7 is a cross-sectional view of a first test lead formed of a test component in an exemplary embodiment of the invention.
Figure 8:
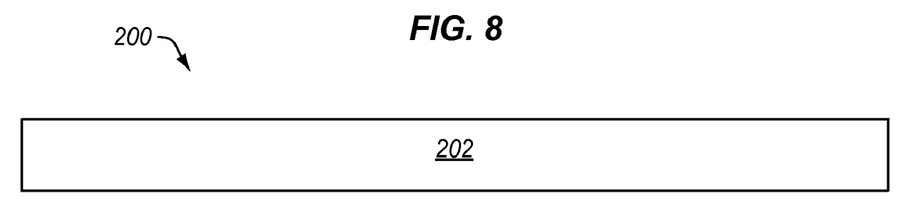
FIG. 8 is a cross-sectional view of a read element with a first shield.

Step 602 of FIG. 6 comprises depositing material to form a first test lead. FIG. 7 is a cross-sectional view of test component 106 with first test lead 402 formed according to step 602. First test lead 402 may be formed by depositing electrically conductive material, such as NiFe, frame-plated on a substrate (not shown) and planarizing the top surface of the conductive material. FIG. 8 is a cross-sectional view of read element 200 with first shield 202, which corresponds with first test lead 402 in FIG. 7.

Figure 9:
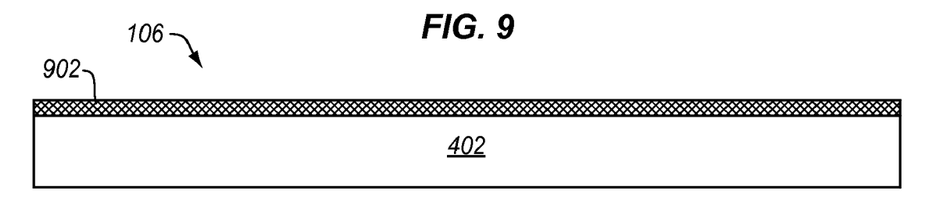
FIG. 9 is a cross-sectional view of the test component with MR material deposited on the first test lead according to the method of FIG. 6 in an exemplary embodiment of the invention.
Figure 10:
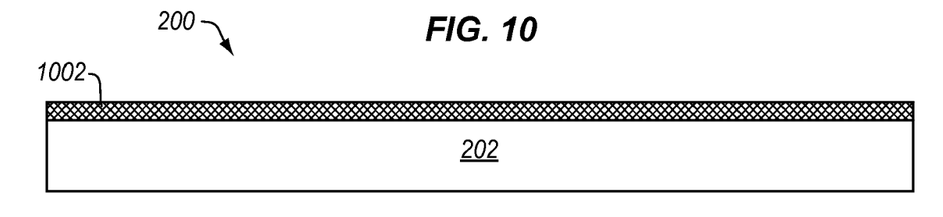
FIG. 10 is a cross-sectional view of the read element with MR material deposited on the first shield.

Step 604 of FIG. 6 comprises depositing MR material on the first test lead 402. Depositing MR material is a multi-layer deposition process for depositing a pinning layer, a pinned layer, a spacer/barrier layer, a free layer, etc. FIG. 9 is a cross-sectional view of test component 106 with MR material 902 deposited according to step 604. FIG. 10 is a cross-sectional view of read element 200 with MR material 1002 deposited.

Figure 11:
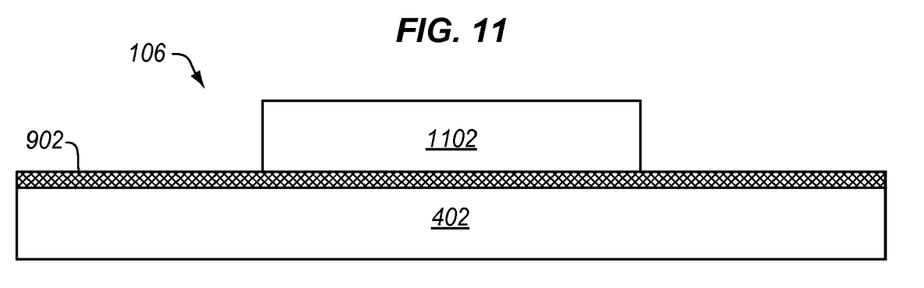
FIG. 11 is a cross-sectional view of the test component with a first photoresist patterned according to the method of FIG. 6 in an exemplary embodiment of the invention.
Figure 12:
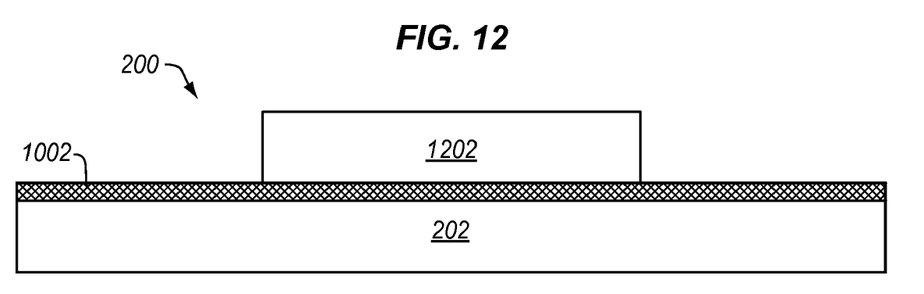
FIG. 12 is a cross-sectional view of the read element with a stripe height photoresist patterned.

Step 606 of FIG. 6 comprises patterning a first photoresist on MR material 902 to define a stripe height and location of a MR sensor. FIG. 11 is a cross-sectional view of test component 106 with first photoresist 1102 patterned according to step 606. Photoresist 1102 may be patterned so that the stripe height of the sensor in test component 106 is substantially similar to a functional read element. FIG. 12 is a cross-sectional view of read element 200 with a stripe height photoresist 1202 patterned.

Figure 13:
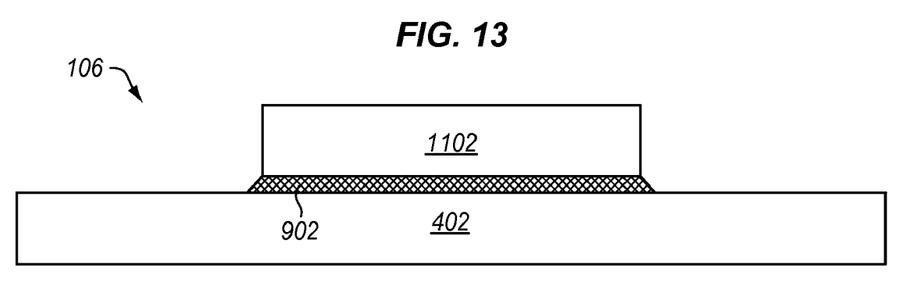
FIG. 13 is a cross-sectional view of the test component after a milling process according to the method of FIG. 6 in an exemplary embodiment of the invention.
Figure 14:
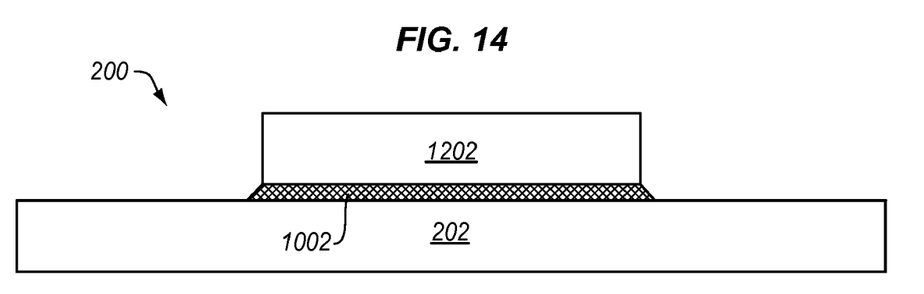
FIG. 14 is a cross-sectional view of the read element after a milling process.

Step 608 of FIG. 6 comprises performing a milling process, or another type of removal process, to remove the portions of MR material 902 exposed by photoresist 1102. FIG. 13 is a cross-sectional view of test component 106 after the milling process of step 606. FIG. 14 is a cross-sectional view of read element 200 after the milling process removes the MR material 1002 exposed by photoresist 1202.

Figure 15:
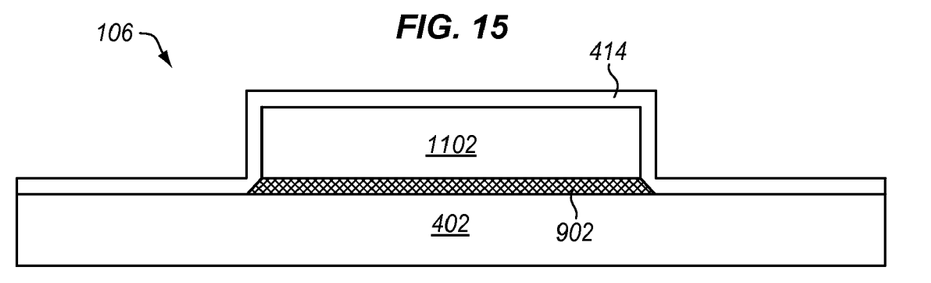
FIG. 15 is a cross-sectional view of the test component with refill material deposited according to the method of FIG. 6 in an exemplary embodiment of the invention.
Figure 16:
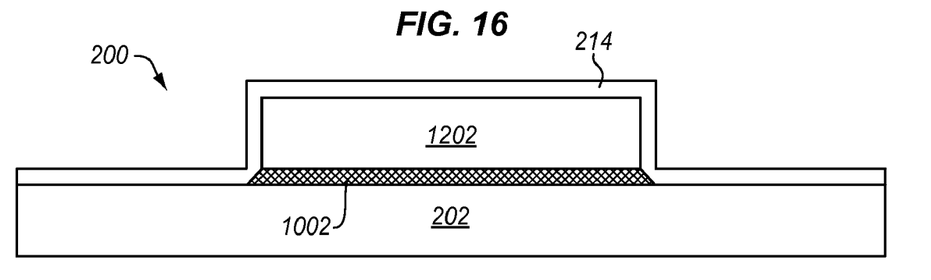
FIG. 16 is a cross-sectional view of the read element with refill material deposited.

Step 610 of FIG. 6 comprises depositing refill material. Refill material includes some type of insulating material, such as alumina. FIG. 15 is a cross-sectional view of test component 106 with refill material 414 deposited according to step 610. When refill material 414 is deposited, it may cover the MR material 902 along the edges of photoresist 1102. This may create a location in which a subsequent milling process may not remove the MR material 902, which may become a possible location for a parasitic shunt to form. FIG. 16 is a cross-sectional view of read element 200 with refill material 214 deposited.

Figure 17:
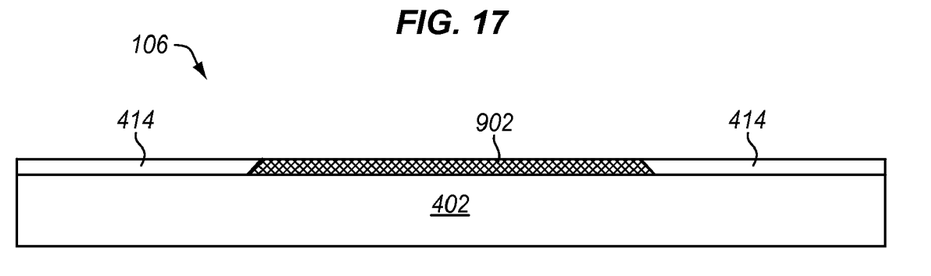
FIG. 17 is a cross-sectional view of the test component with the first photoresist removed according to the method of FIG. 6 in an exemplary embodiment of the invention.
Figure 18:
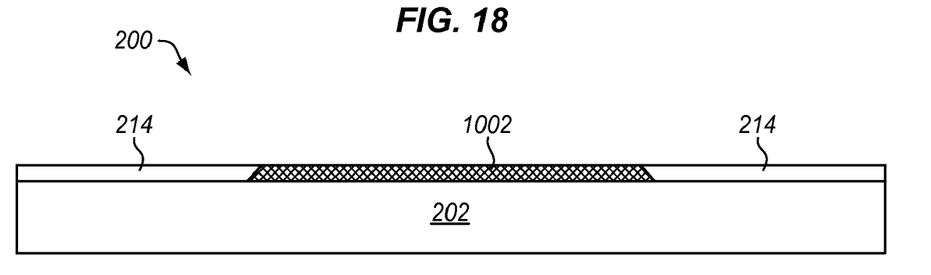
FIG. 18 is a cross-sectional view of the read element with the stripe height photoresist removed.

Step 612 of FIG. 6 comprises removing the first photoresist 1102. Photoresist 1102 may be removed with a chemical mechanical polishing (CMP) assisted lift-off process. FIG. 17 is a cross-sectional view of test component 106 with photoresist 1102 removed according to step 612. FIG. 18 is a cross-sectional view of read element 200 with photoresist 1202 removed.

Figure 19:
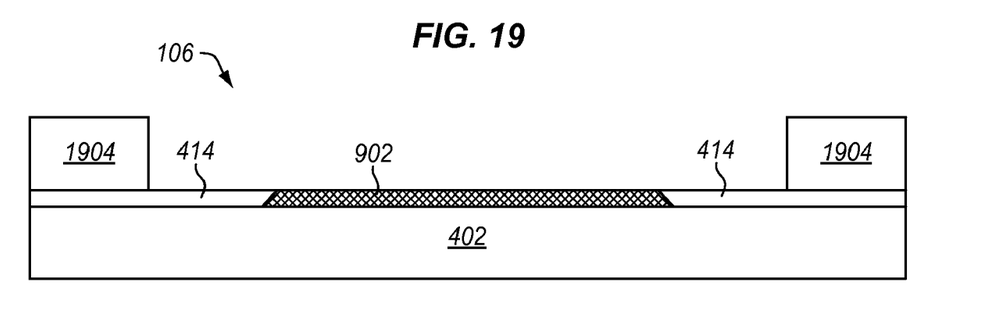
FIG. 19 is a cross-sectional view of the test component with a second photoresist patterned according to the method of FIG. 6 in an exemplary embodiment of the invention.
Figure 20:
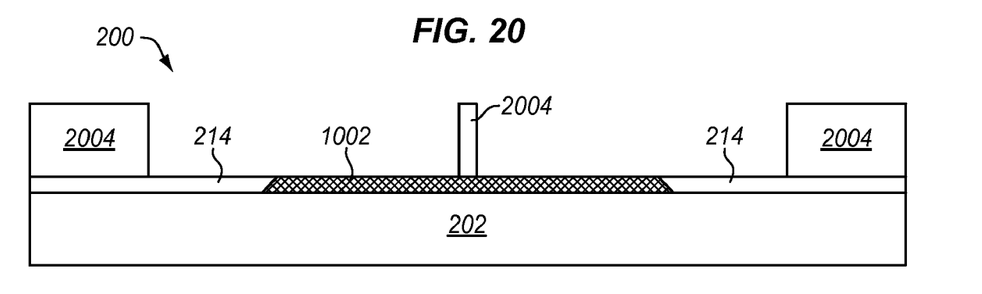
FIG. 20 is a cross-sectional view of the read element with a track width photoresist patterned.

Step 614 of FIG. 6 comprises patterning a second photoresist to include an opening exposing the remaining MR material 902. FIG. 19 is a cross-sectional view of test component 106 with a second photoresist 1904 patterned according to step 614. Because test component 106 will not include a MR sensor, the second photoresist 1904 has an opening to expose the remaining MR material for removal in a subsequent milling process step. FIG. 20 is a cross-sectional view of read element 200 with a track width photoresist 2004 patterned. Patterning photoresist 1904 on test component 106 may be performed concurrently with patterning photoresist 2004 on read element 200.

Figure 21:
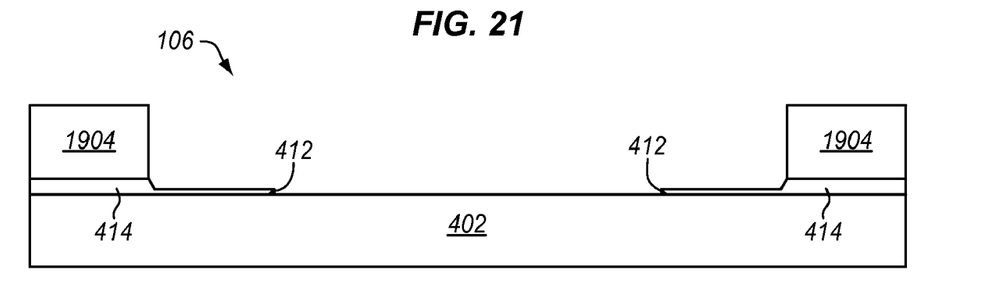
FIG. 21 is a cross-sectional view of the test component after a milling process according to the method of FIG. 6 in an exemplary embodiment of the invention.
Figure 22:
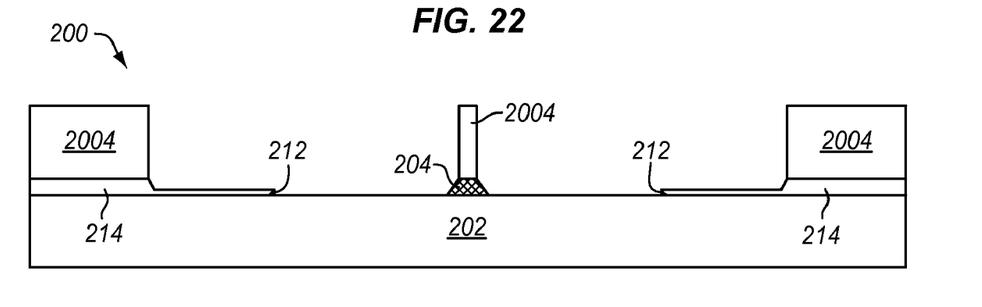
FIG. 22 is a cross-sectional view of the read element after a milling process.

Step 616 of FIG. 6 comprises performing a milling process to remove the remaining MR material 902 exposed by photoresist 1904. FIG. 21 is a cross-sectional view of test component 106 after the milling process of step 616. Because photoresist 1904 exposes the remaining MR material 902 and refill material 414 to the milling process, a MR sensor will not be formed in test component 106. After the milling process, potential sources of parasitic shunts due to MR material 902 left in the location indicated by MR material 412 of FIG. 21 may remain in test component 106. MR material 412 may remain after the milling process due to refill material 414 capturing a portion of MR material 902 on the edges of the milling process of step 608. FIG. 22 is a cross-sectional view of read element 200 after the milling process. MR material 212 in read element 200 indicates potential sources of parasitic shunts, for similar reasons as for test component 106. After the milling process, an MR sensor 204 is defined in read element 200 from the MR material 1002 (see FIG. 20).

Figure 23:
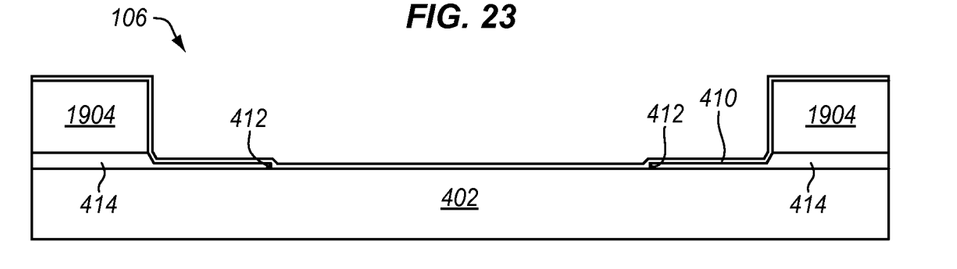
FIG. 23 is a cross-sectional view of the test component with insulating material deposited according to the method of FIG. 6 in an exemplary embodiment of the invention.
Figure 24:
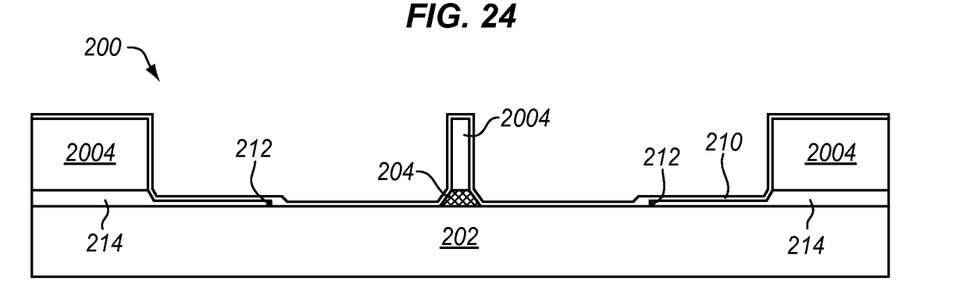
FIG. 24 is a cross-sectional view of the read element with insulating material deposited.

Step 618 of FIG. 6 comprises depositing insulating material on first test lead 402. FIG. 23 is a cross-sectional view of test component 106 with insulating material 410 deposited according to step 618. FIG. 24 is a cross-sectional view of read element 200 with insulating material 210 deposited.

Figure 25:
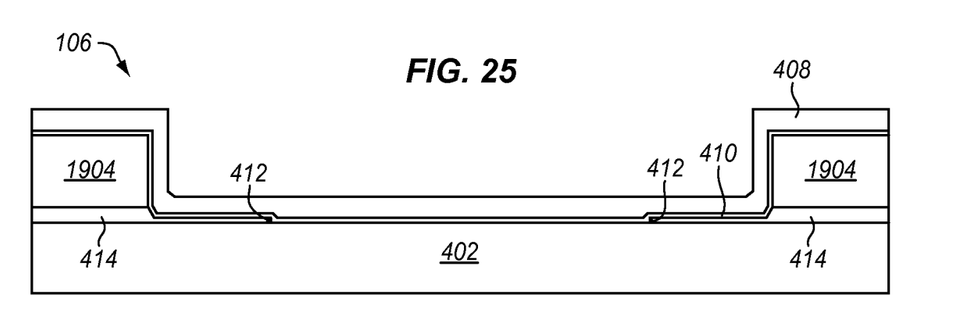
FIG. 25 is a cross-sectional view of the test component with hard bias magnet material deposited according to the method of FIG. 6 in an exemplary embodiment of the invention.
Figure 26:
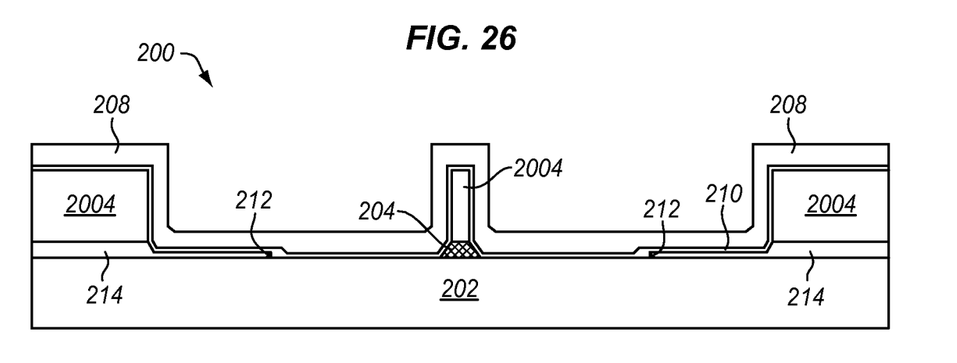
FIG. 26 is a cross-sectional view of the read element with hard bias magnet material deposited.

Step 620 of FIG. 6 comprises depositing hard bias magnet material. FIG. 25 is a cross-sectional view of test component 106 with hard bias magnet material 408 deposited according to step 620. FIG. 26 is a cross-sectional view of read element 200 with hard bias magnet material 208 deposited.

Figure 27:
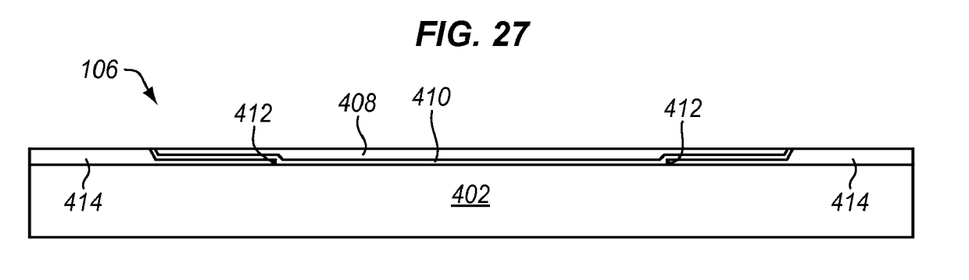
FIG. 27 is a cross-sectional view of the test component with the second photoresist removed according to the method of FIG. 6 in an exemplary embodiment of the invention.
Figure 28:
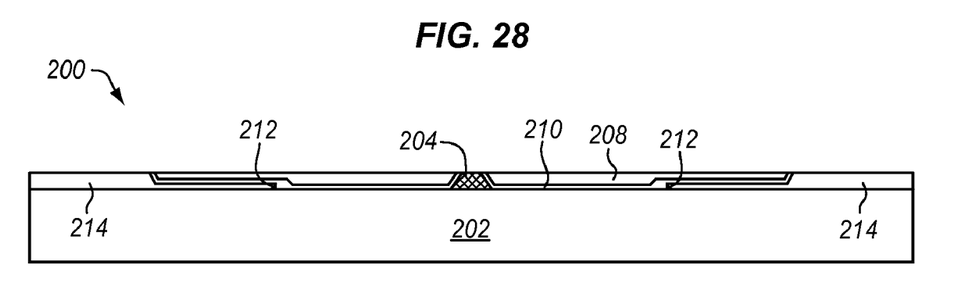
FIG. 28 is a cross-sectional view of the read element with the track width photoresist removed.

Step 622 of FIG. 6 comprises removing the second photoresist 1904. The second photoresist 1904 may be removed with a CMP assisted lift-off process. FIG. 27 is a cross-sectional view of test component 106 with photoresist 1904 removed according to step 622. FIG. 28 is a cross-sectional view of read element 200 with photoresist 2004 removed.

Figure 29:
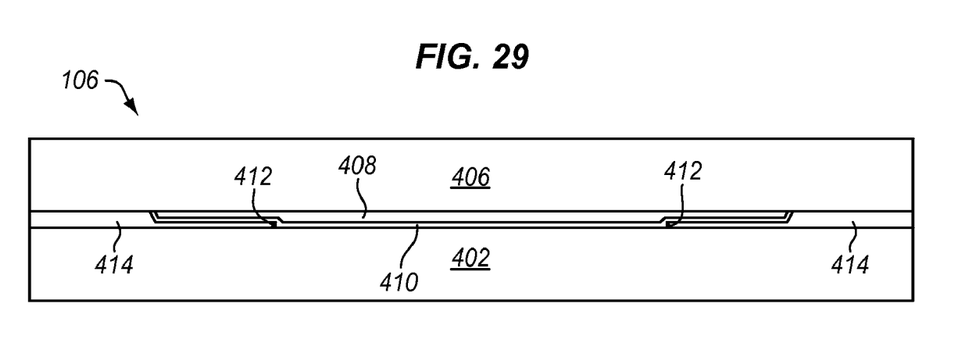
FIG. 29 is a cross-sectional view of the test component with a second test lead formed according to the method of FIG. 6 in an exemplary embodiment of the invention.
Figure 30:
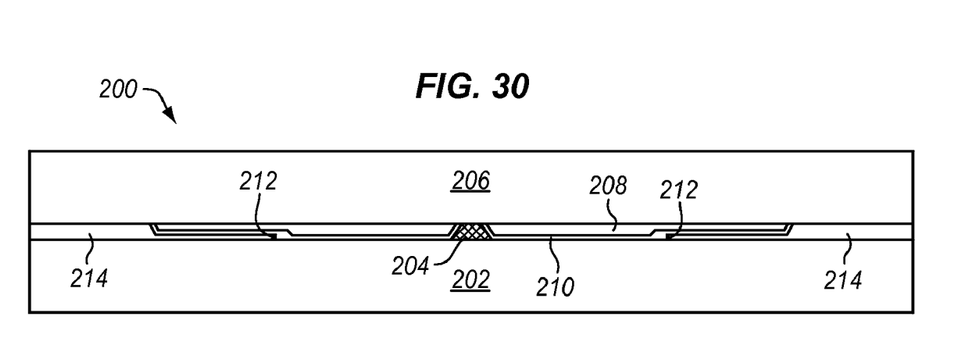
FIG. 30 is a cross-sectional view of the read element with a second shield formed.

Step 624 of FIG. 6 comprises depositing material to form a second test lead. FIG. 29 is a cross-sectional view of test component 106 with second test lead 406 formed according to step 624. FIG. 30 is a cross-sectional view of read element 200 with second shield 206 formed.

FIG. 29 thus shows the fabricated test component 106 just as shown in FIG. 4. Similarly, FIG. 30 shows the fabricated read element 200 just as shown in FIG. 2. Because test component 106 is fabricated without a conductive MR sensor in the expected element region, measuring a resistance of test component 106 will allow the measurement of any parasitic shunts formed by the fabrication process. Furthermore, because test component 106 and read element 200 are fabricated by the same or similar processes, an indication of the formation of parasitic shunts in test component 106 are indicative that parasitic shunts may have formed in read element 200. Thus, the quality of the fabrication process used to form read element 200 in magnetic head 104 on wafer 102 may be determined (see FIG. 1).

Test component 106 as illustrated in FIG. 5 is also adapted to allow measurements of parasitic shunts formed during the fabrication process. While the test component 106 of FIG. 4 is sensitive to parasitic shunts formed in region 416, test component 106 of FIG. 5 is sensitive to parasitic shunts formed in regions 516. Because of the additional refill material 512, and other modifications to the fabrication processes, the first test lead 502 and the second test lead 506 have a larger spacing between them. This increased spacing reduces the possibilities of parasitic shunts forming in the region 416 of FIG. 5, and therefore is adapted to test for parasitic shunts formed outside of this region.

Figure 31:
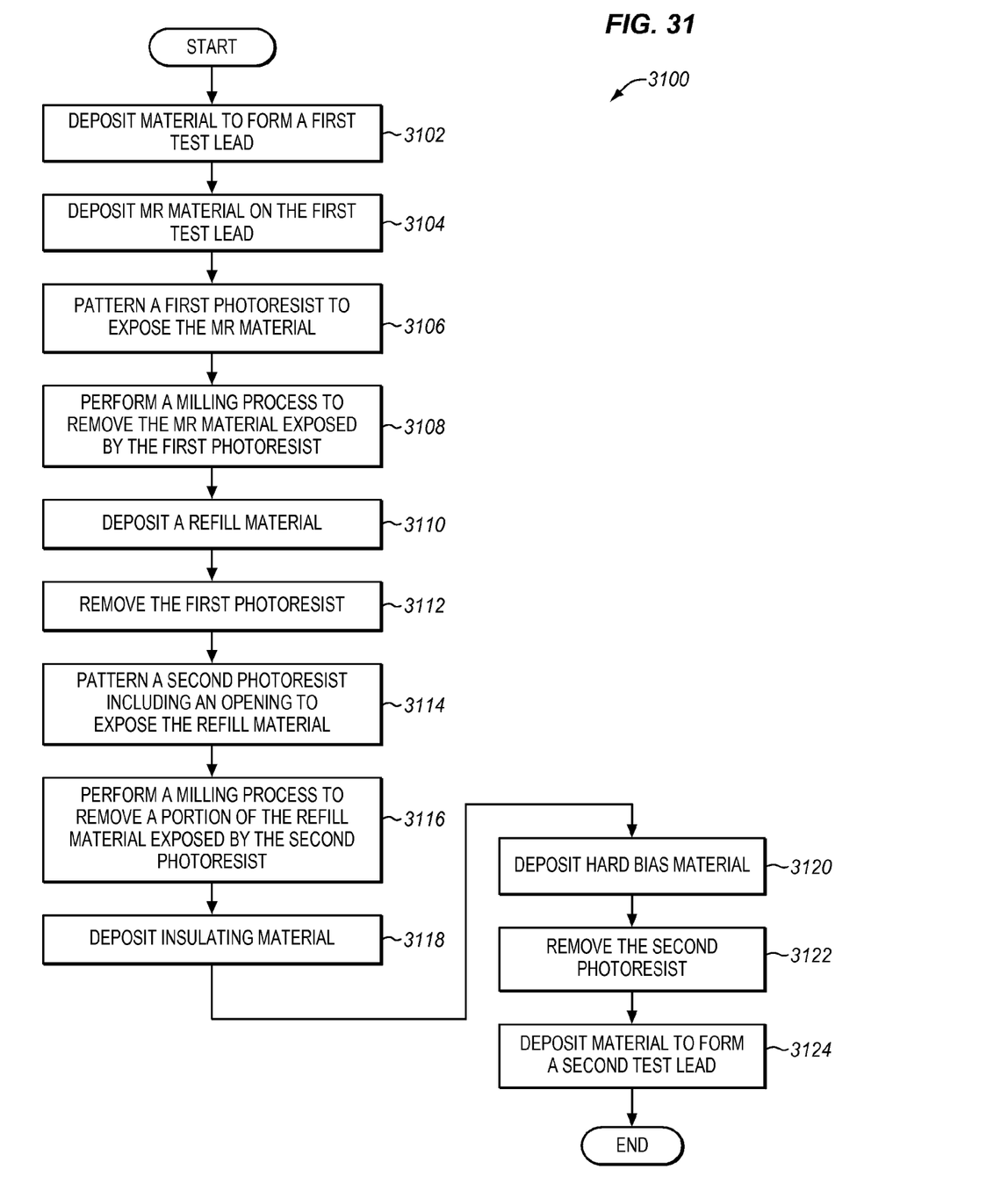
FIG. 31 is a flow chart illustrating a method of fabricating the test component of FIG. 5 in exemplary embodiment of the invention.

FIG. 31 is a flow chart illustrating another method 3100 of fabricating a test component 106 as illustrated in FIG. 5 in an exemplary embodiment of the invention. FIGS. 32-41 illustrate the results of the steps of method 3100 to fabricate test component 106 in exemplary embodiments of the invention. The steps of the flow chart in FIG. 31 are not all inclusive and may include other steps not shown. Method 3100 is just one example of how to fabricate test component 106 as illustrated in FIG. 5, as other methods may be performed in other embodiments to fabricate test component 106.

Figure 32:
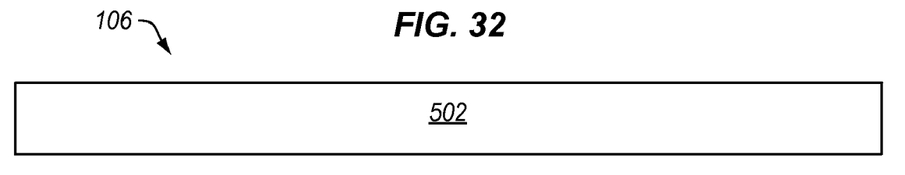
FIG. 32 is a cross-sectional view of a first test lead formed of a test component in an exemplary embodiment of the invention.

Step 3102 comprises depositing conductive material to form a first test lead. FIG. 32 is a cross-sectional view of test component 106 with first test lead 502 deposited according to step 3102.

Figure 33:
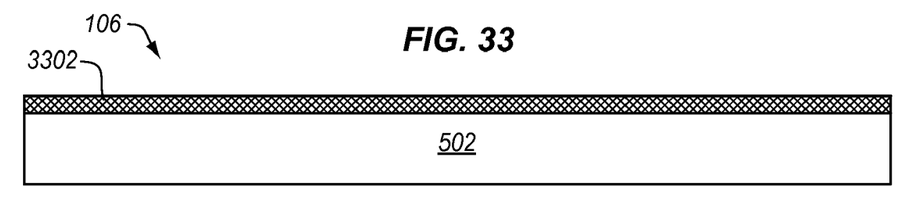
FIG. 33 is a cross-sectional view of the test component after depositing MR material on the first test lead according to the method of FIG. 31 in an exemplary embodiment of the invention.

Step 3104 of FIG. 31 comprises depositing MR material on first test lead 502. FIG. 33 is a cross-sectional view of test component 106 with MR material 3302 deposited according to step 3104.

Step 3106 of FIG. 31 comprises patterning a first photoresist on the MR material 3302. FIG. 33 additionally is a cross-sectional view of test component 106 with a first photoresist patterned according to step 3106. Those skilled in the art will recognize that the first photoresist is patterned to include an opening to expose all the MR material 3302. Thus, the first photoresist is not visible in FIG. 33. Patterning the first photoresist in FIG. 33 corresponds with patterning a stripe height photoresist on read element 200 as illustrated by FIG. 12.

Figure 34:
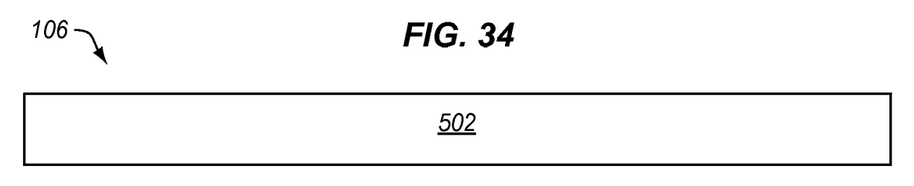
FIG. 34 is a cross-sectional view of the test component with a first photoresist patterned according to the method of FIG. 31 in an exemplary embodiment of the invention.
Figure 35:
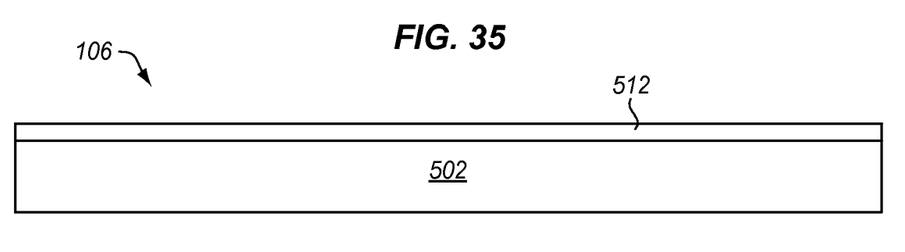
FIG. 35 is a cross-sectional view of the test component after depositing refill material according to the method of FIG. 31 in an exemplary embodiment of the invention.
Figure 36:
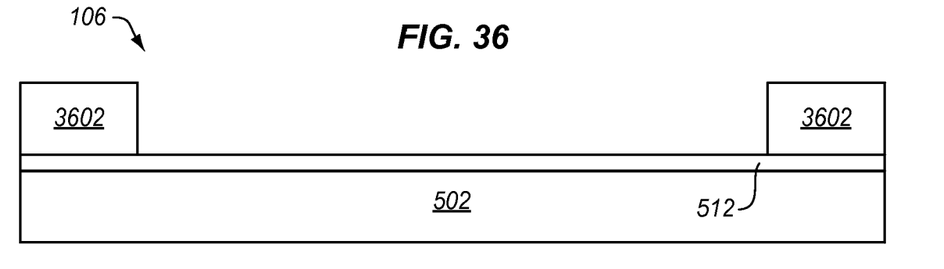
FIG. 36 is a cross-sectional view of the test component after patterning a second photoresist according to the method of FIG. 31 in an exemplary embodiment of the invention.

Step 3108 of FIG. 31 comprises performing a milling process to remove the portions of MR material 3302 exposed by the first photoresist. Because the opening of the first photoresist includes the entire area of MR material 3302, MR material 3302 will be removed. FIG. 34 is a cross-sectional view of test component 106 after the milling process of step 3108. Step 3110 of FIG. 31 comprises depositing refill material on first test lead 502. FIG. 35 is a cross-sectional view of test component 106 with refill material 512 deposited according to step 3110. Step 3112 of FIG. 31 comprises removing the first photoresist. FIG. 35 additionally is a cross-sectional view of test component 106 with the first photoresist removed according to step 3112. Step 3114 of FIG. 31 comprises patterning a second photoresist. FIG. 36 is a cross-sectional view of test component 106 with a second photoresist 3602 patterned according to step 3114. Second photoresist 3602 is similar to the track width photoresist 2004 shown in FIG. 20 for read element 200, with the exception that a MR sensor is not defined.

Figure 37:
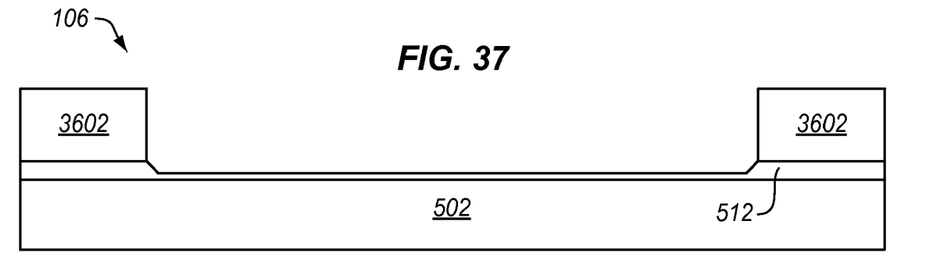
FIG. 37 is a cross-sectional view of the test component after performing a milling process according to the method of FIG. 31 in an exemplary embodiment of the invention.
Figure 38:
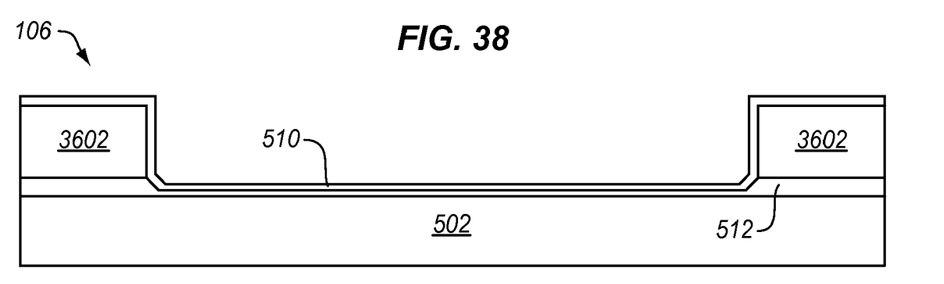
FIG. 38 is a cross-sectional view of the test component after depositing an insulating material according to the method of FIG. 31 in an exemplary embodiment of the invention.

Step 3116 of FIG. 31 comprises performing a milling process to remove some refill material 512 exposed by photoresist 3602. Refill material 512 is harder to remove than typical MR material, so some refill material 512 may remain. FIG. 37 is a cross-sectional view of test component 106 after the milling process of step 3116. Step 3118 of FIG. 31 comprises depositing insulating material on refill material 512. FIG. 38 is a cross-sectional view of test component 106 with insulating material 510 deposited according to step 3118. Step 3120 of FIG. 31 comprises depositing hard bias magnet material.

Figure 39:
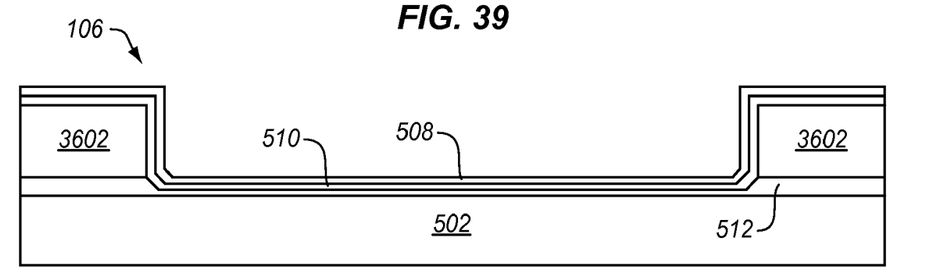
FIG. 39 is a cross-sectional view of the test component after depositing hard bias magnet material according to the method of FIG. 31 in an exemplary embodiment of the invention.
Figure 40:
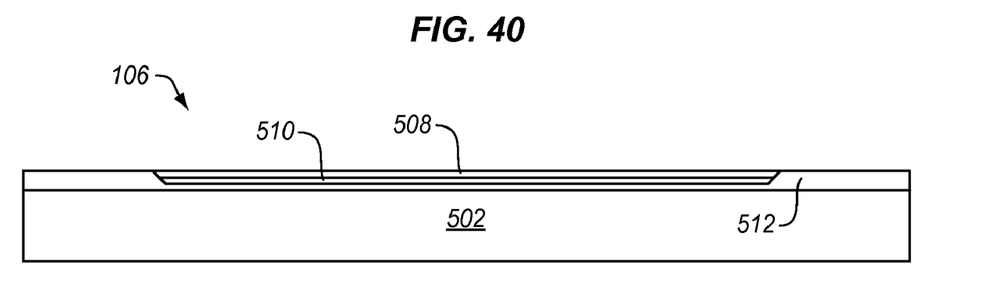
FIG. 40 is a cross-sectional view of the test component after removing the second photoresist according to the method of FIG. 31 in an exemplary embodiment of the invention.
Figure 41:
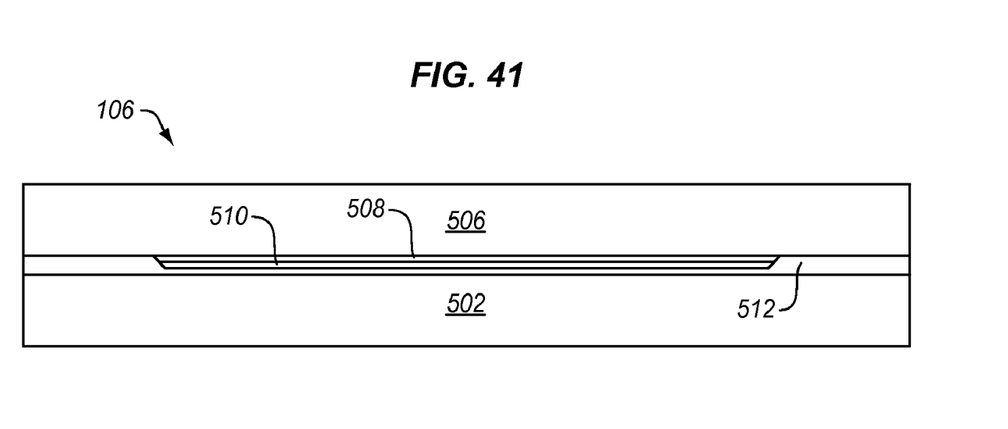
FIG. 41 is a cross-sectional view of the test component after depositing material to form the second test lead according to the method of FIG. 31 in an exemplary embodiment of the invention.

FIG. 39 is a cross-sectional view of test component 106 with hard bias magnet material 508 deposited according to step 3120. Step 3122 of FIG. 31 comprises removing the second photoresist 3602. FIG. 40 is a cross-sectional view of test component 106 with the photoresist 3602 removed according to step 3122. Step 3124 of FIG. 31 comprises depositing material to form a second test lead. FIG. 41 is a cross-sectional view of test component 106 with second test lead 506 formed according to step 3124. FIG. 41 thus shows the fabricated test component 106 just as shown in FIG. 5.

Although specific embodiments were described herein, the scope of the invention is not limited to those specific embodiments. The scope of the invention is defined by the following claims and any equivalents thereof.

We claim:

1. A method of testing the quality of a fabrication process used to form read elements in magnetic heads on a wafer, the method comprising:
    fabricating a test component on the wafer along with the magnetic heads, the test component including:
        a first test lead;
        a second test lead; and
        at least hard bias magnet material and insulating material between the first test lead and the second test lead,
        wherein the test component is fabricated to not include a magnetoresistance (MR) sensor;
    measuring a resistance of the test component to identify parasitic shunts between the first test lead and the second test lead; and
    determining the quality of the fabrication process based on the measured resistance of the test component.

2. The method of claim 1 wherein fabricating a test component comprises:
    fabricating a plurality of test components staggered throughout the wafer.

3. The method of claim 1 wherein fabricating a test component on the wafer along with the magnetic heads comprises:
    fabricating the test component concurrently with fabricating the magnetic heads.

4. A test component on a wafer of magnetic heads, the test component comprising:
    a first test lead;
    a second test lead; and
    at least hard bias magnet material and insulating material between the first test lead and the second test lead,
    wherein the test component is fabricated to not include a magnetoresistance (MR) sensor.

5. The test component of claim 4 wherein the first test lead and the second test lead allow a probe to measure a resistance to identify parasitic shunts between the first test lead and the second test lead.

* * * * *